(12) United States Patent
Kim et al.

(10) Patent No.: US 11,948,777 B2
(45) Date of Patent: Apr. 2, 2024

(54) METHOD OF MANUFACTURING SEMICONDUCTOR DEVICE

(71) Applicant: SAMSUNG ELECTRONICS CO., LTD., Suwon-si (KR)

(72) Inventors: Yonghee Kim, Yongin-si (KR); Dougyong Sung, Seoul (KR); Taekjoon Rhee, Hwaseong-si (KR); Sungwook Hong, Hwaseong-si (KR); Hakyoung Kim, Bucheon-si (KR); Sangmin Jeong, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 210 days.

(21) Appl. No.: 17/552,698

(22) Filed: Dec. 16, 2021

(65) Prior Publication Data
US 2023/0005713 A1    Jan. 5, 2023

(30) Foreign Application Priority Data

Jun. 30, 2021 (KR) .................. 10-2021-0085767

(51) Int. Cl.
*C23C 16/02* (2006.01)
*H01J 37/32* (2006.01)

(52) U.S. Cl.
CPC ...... *H01J 37/3244* (2013.01); *C23C 16/0245* (2013.01)

(58) Field of Classification Search
None
See application file for complete search history.

(56) References Cited

U.S. PATENT DOCUMENTS

| | | | |
|---|---|---|---|
| 6,489,248 B2 | 12/2002 | Zhang et al. | |
| 6,784,108 B1 | 8/2004 | Donohoe et al. | |
| 7,183,219 B1 | 2/2007 | Hama et al. | |
| 8,703,619 B2 * | 4/2014 | Araki | G11B 7/22 |
| | | | 438/735 |
| 8,735,291 B2 | 5/2014 | Ranjan et al. | |
| 9,054,050 B2 | 6/2015 | LeFevre et al. | |
| 9,187,319 B2 | 11/2015 | Wei et al. | |
| 9,318,343 B2 * | 4/2016 | Ranjan | H01L 29/6656 |
| 9,666,447 B2 | 5/2017 | Rastogi et al. | |
| 10,366,902 B2 | 7/2019 | Ranjan et al. | |
| 11,527,414 B2 * | 12/2022 | Fung | H01L 21/32136 |
| 2020/0234970 A1 | 7/2020 | Hoshi et al. | |

FOREIGN PATENT DOCUMENTS

KR    10-2216380 B1    2/2021

* cited by examiner

*Primary Examiner* — Allan W. Olsen
(74) *Attorney, Agent, or Firm* — Sughrue Mion, PLLC

(57) ABSTRACT

A method of manufacturing a semiconductor device includes: providing a first process gas including oxygen and a second process gas including carbon and fluorine to a process chamber at a first flow rate ratio to etch an etch target layer; and providing the first process gas and the second process gas to the process chamber at a second flow rate ratio to passivate the etch target layer, wherein a flow rate of the first process gas is substantially constant.

19 Claims, 13 Drawing Sheets

METHOD OF MANUFACTURING SEMICONDUCTOR DEVICE

CROSS-REFERENCE TO RELATED APPLICATION

This application is based on and claims priority under 35 U.S.C. 119 to Korean Patent Application No. 10-2021-0085767, filed on Jun. 30, 2021, in the Korean Intellectual Property Office, the disclosure of which is incorporated by reference herein in its entirety.

BACKGROUND

Methods and apparatuses consistent with example embodiments of the inventive concept relate to manufacturing a semiconductor device by using plasma.

Semiconductor devices are formed by using various semiconductor manufacturing processes such as deposition processes, ion injection processes, photolithography processes, and etching processes. Along with the high integration of semiconductor devices, line widths of patterns included in the semiconductor devices have been decreasing, and aspect ratios of contacts and vias have been increasing. This decrease in line widths or increase in aspect ratios of contacts and vias causes a gradual increase in difficulty of a semiconductor manufacturing process. Accordingly, various methods of forming a fine structure of a high aspect ratio with high reliability have been researched.

SUMMARY

The example embodiments provide methods of manufacturing a semiconductor device of which the reliability is enhanced.

According to embodiments, a method of manufacturing a semiconductor device is provided. The method may include: providing a first process gas including oxygen and a second process gas including carbon and fluorine to a process chamber at a first flow rate ratio to etch an etch target layer, the process chamber providing a space for treating the etch target layer; and providing the first process gas and the second process gas to the process chamber at a second flow rate ratio to passivate the etch target layer, wherein the providing of the first process gas and the second process gas at the first flow rate ratio and the providing of the first process gas and the second process gas at the second flow rate ratio are alternately and iteratively performed, in the providing of the first process gas and the second process gas at the first flow rate ratio and the providing of the first process gas and the second process gas at the second flow rate ratio, source power for generating plasma based on the first and second process gases and bias power for accelerating the plasma are provided to the process chamber to be substantially constant, and in the providing of the first process gas and the second process gas at the first flow rate ratio and the providing of the first process gas and the second process gas at the second flow rate ratio, a flow rate of the first process gas is substantially constant.

According to embodiments, a method of manufacturing a semiconductor device is provided. The method may include: etching an etchtarget layer by providing a first process gas to a process chamber, in which a wafer is mounted, to be substantially constant at a first flow rate; and providing a second process gas to the process chamber at a pulse varying between a second flow rate and a third flow rate, wherein source power for generating plasma based on the first and second process gases and bias power for accelerating the plasma are provided to the process chamber to be constant, one of the first process gas and the second process gas is an etchant gas, the other one thereof is passivant gas, and each of the first to third flow rates is greater than zero.

According to embodiments, a method of manufacturing a semiconductor device is provided. The method may include: etching an etch target layer by a first target etching amount; and further etching the etch target layer by a second target etching amount, wherein the etching of the etch target layer by the first target etching amount includes: providing a first process gas including oxygen and a second process gas including carbon and fluorine to a process chamber at a first flow rate ratio to etch the etch target layer, the process chamber providing a space for treating the etch target layer; and providing the first process gas and the second process gas to the process chamber at a second flow rate ratio to passivate the etch target layer, wherein the providing of the first process gas and the second process gas at the first flow rate ratio and the providing of the first process gas and the second process gas at the second flow rate ratio are alternately and iteratively performed, and in the providing of the first process gas and the second process gas at the first flow rate ratio and the providing of the first process gas and the second process gas at the second flow rate ratio, the first process gas is provided at a first flow rate that is substantially constant, the further etching of the etch target layer by the second target etching amount includes: providing the first process gas and the second process gas to the process chamber at a third flow rate ratio to etch the etch target layer; and providing the first process gas and the second process gas to the process chamber at a fourth flow rate ratio to passivate the etch target layer, wherein the providing of the first process gas and the second process gas at the third flow rate ratio and the providing of the first process gas and the second process gas at the fourth flow rate ratio are alternately and iteratively performed, in the providing of the first process gas and the second process gas at the first flow rate ratio and the providing of the first process gas and the second process gas at the second flow rate ratio, the first process gas is provided as a second flow rate that is substantially constant, and the second flow rate is greater than the first flow rate.

According to embodiments of the inventive concept, a method of manufacturing a semiconductor device is provided. The method may include: providing an etch target layer onto a wafer; forming a plurality of storage node holes in the etch target layer; and providing a conductive material to the plurality of the storage node holes and planarizing the same to form a plurality of storage node electrodes, wherein the forming the plurality of the storage node holes includes: etching the etch target layer by a first target etching amount; and further etching the etch target layer by a second target etching amount, wherein the etching of the etch target layer by the first target etching amount includes: providing a first process gas including oxygen and a second process gas including carbon and fluorine to a process chamber, in which the wafer is mounted, at a first flow rate ratio to etch the etch target layer; and providing the first process gas and the second process gas to the process chamber at a second flow rate ratio to passivate the etch target layer, wherein the providing of the first process gas and the second process gas at the first flow rate ratio and the providing of the first process gas and the second process gas at the second flow rate ratio are alternately and iteratively performed, and in the providing of the first process gas and the second process gas at the first flow rate ratio and the providing of the first process gas and the second process gas at the second flow rate ratio, the first process gas is provided at a first flow rate that is substantially constant.

BRIEF DESCRIPTION OF THE DRAWINGS

Example embodiments of the inventive concept will be more clearly understood from the following detailed description taken in conjunction with the accompanying drawings, in which.

DETAILED DESCRIPTION

Figure 1:
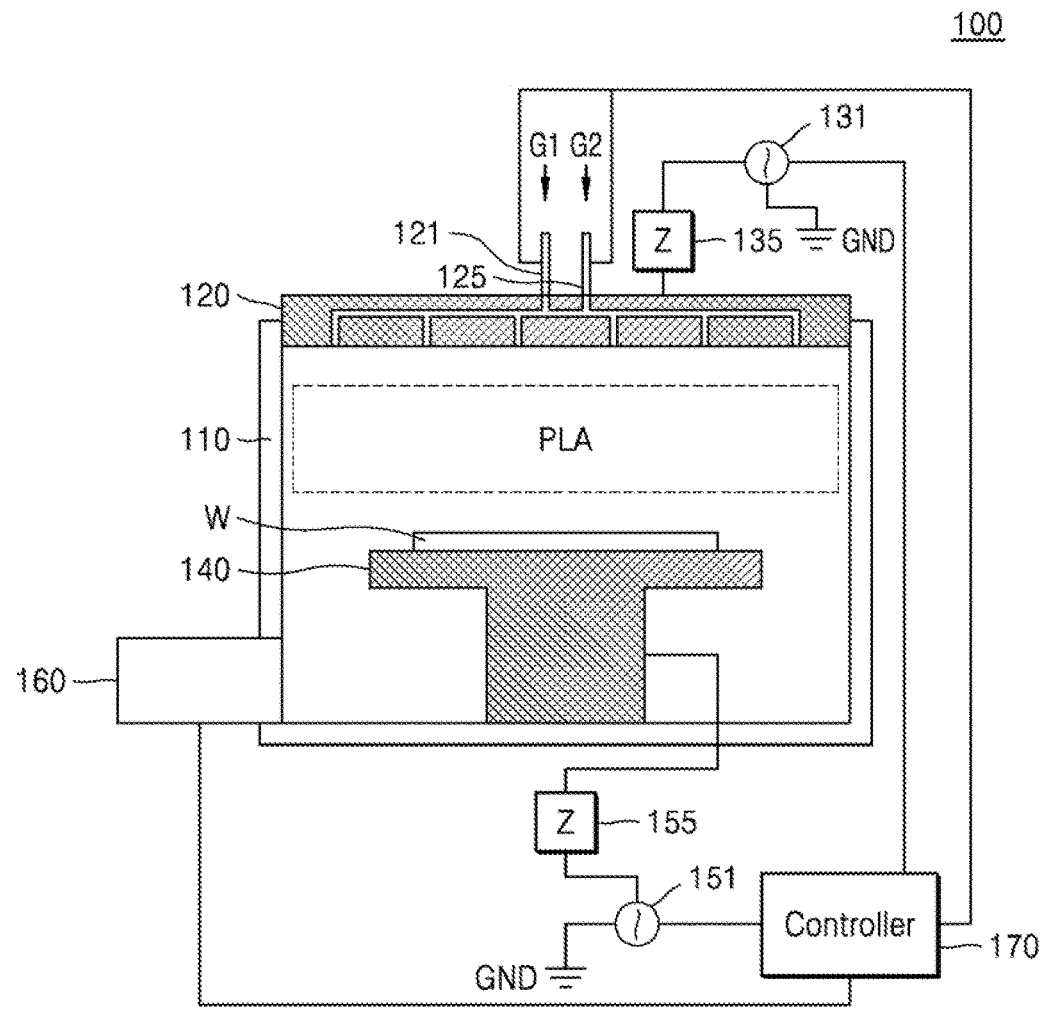
FIG. 1 is a cross-sectional view of a wafer treatment apparatus according to embodiments.

Hereinafter, various embodiments of the inventive concept are described in detail with reference to the accompanying drawings. All of these embodiments are example embodiments. Like reference numerals in the drawings denote like elements, and thus their repetitive description will be omitted.

FIG. 1 is a cross-sectional view of a wafer treatment apparatus 100 according to embodiments.

Referring to FIG. 1, the wafer treatment apparatus 100 may include a process chamber 110, a gas distribution device 120, a first power source 131, a first matching network 135, a wafer supporter 140, a second power source 151, a second matching network 155, a vacuum pumping system 160, and a controller 170.

The process chamber 110 may provide an internal space in which a semiconductor device manufacturing process is performed. The semiconductor device manufacturing process may be, for example, a plasma process. According to example embodiments, the semiconductor device manufacturing process may be reactive ion etching (RIE), and the wafer treatment apparatus 100 may be an RIE reactor configured to perform an etching process of a high aspect ratio by using plasma PLA but is not limited thereto. The wafer treatment apparatus 100 may perform processes, e.g., plasma annealing, plasma reinforcement, chemical vapor deposition (CVD), physical vapor deposition (PVD), plasma cleaning, and the like.

According to embodiments, although embodiments according to the technical idea of the inventive concept are mainly described based on a case where the wafer treatment apparatus 100 uses capacitively coupled plasma (CCP), this is a non-limiting example, and the inventive concept is not limited even by any meaning. Those of ordinary skill in the art may easily achieve a wafer treatment apparatus using any one of electron cyclotron resonance (ECR) plasma, inductively coupled plasma (ICP), helical plasma, and high density plasma based on the description made herein.

The process chamber 110 may be configured to generate the plasma PLA in a plasma treatment space near the surface of a wafer W. The plasma PLA may be used to deposit particular materials on the wafer W and/or to assist removal of a material from exposed surfaces of the wafer W.

The wafer W may be a semiconductor substrate having various diameters, e.g., 150 mm, 200 mm, and 300 mm. The wafer W may include a semiconductor material, e.g., silicon, germanium, silicon-germanium, or the like, and may further include an epitaxial layer, a silicon on insulator (SOI) layer, a germanium on insulator (GOI) layer, a semiconductor on insulator (SeOI) layer, or the like.

The gas distribution device 120 functioning as an upper electrode and the wafer supporter 140 functioning as a lower electrode may be disposed inside the process chamber 110. Ionizable gas including first and second gases G1 and G2 or a mixture of process gases is introduced to the process chamber 110 through the gas distribution device 120. The gas distribution device 120 may uniformly provide the first and second gases G1 and G2 to the inside of the process chamber 110. A flow rate of each of the first and second gases G1 and G2 may be controlled by first and second process gas supply devices 121 and 125. Each of the first and second process gas supply devices 121 and 125 may include an automatic pressure controller.

According to embodiments, the first power source 131 may be connected to the gas distribution device 120. The first power source 131 may supply, to the wafer treatment apparatus 100, source power for generating the plasma PLA. While performing a semiconductor manufacturing process, the plasma PLA may be generated from the first and second process gases G1 and G2 by the source power. The source power may be provided by a signal in a radio frequency (RF) range. According to embodiments, a frequency of a signal corresponding to the source power may be about 40 MHz to about 200 MHz but is not limited thereto. According to embodiments, a period of the signal corresponding to the source power may be about 0.5 ns to about 2.5 ns but is not limited thereto.

The first power source 131 may be coupled to the gas distribution device 120 through the first matching network 135. According to embodiments, the first matching network 135 may enhance a transmission efficiency of high frequency power supplied by the first power source 131. The first matching network 135 may enhance transfer efficiency of the source power to the plasma PLA by reducing reflected power. The first matching network 135 may include, for example, a matching box and a band-pass filter.

According to embodiments, the wafer supporter 140 may be an electrostatic chuck. The wafer treatment apparatus 100 may further include an electrostatic clamping system configured to provide, to the wafer supporter 140, a clamping voltage for fixing the wafer W. However, the wafer supporter 140 is not limited thereto, and the wafer supporter 140 may be a vacuum chuck configured to fix the wafer W by using vacuum pressure.

The second power source 151 may be connected to the wafer supporter 140. The second power source 151 may generate bias power of a sinusoidal wave and/or a non-sinusoidal wave (e.g., a square wave) or a designed wave while treating the wafer W, and provide the generated bias power to the wafer supporter 140. Herein, the designed wave indicates a voltage waveform designed to make constant a difference between a potential of the plasma PLA and a potential of the wafer W in a period in which positive ions in the plasma PLA are accelerated to offset a change in the potential of the wafer W according to accumulation of positive ions on the wafer W.

According to embodiments, a frequency of a signal corresponding to the bias power generated by the second power source 151 may be in a range of about 100 KHz to about 3 MHz. According to embodiments, the frequency of the signal corresponding to the bias power generated by the second power source 151 may be in a range of about 400 KHz to about 2 MHz.

The bias power generated by the second power source 151 may supply energy to the plasma PLA. According to embodiments, the second power source 151 may generate the bias power to accelerate ions in the plasma PLA. According to embodiments, when the bias power generated by the second power source 151 is provided as a non-sinusoidal low frequency, e.g., a square wave, a designed wave, or the like, energy of ions in the plasma PLA, which have arrived at the wafer W, may be distributed in a narrow band.

The second power source 151 may be coupled to the wafer supporter 140 through the second matching network 155. According to embodiments, the second matching network 155 may enhance a transmission efficiency of high frequency power supplied by the second power source 151. The second matching network 155 may enhance transfer of the bias power by reducing reflected power. If the second power source 151 supplies a non-sinusoidal wave, the second matching network 155 may include a plurality of matching boxes and a plurality of band-pass filters corresponding to different frequency bands.

According to embodiments, the vacuum pumping system 160 may include a turbo-molecular vacuum pump (TMP), and a gate valve configured to throttle chamber pressure. According to embodiments, the vacuum pumping system 160 may include a mechanical booster pump and a dry roughing pump.

The controller 170 may be configured to control operations of the first and second process gas supply devices 121 and 125, the first power source 131, the wafer supporter 140, the second power source 151, and the vacuum pumping system 160. The controller 170 may be implemented by hardware, firmware, software, or a random combination thereof. For example, the controller 170 may include a computing device, such as a workstation computer, a desktop computer, a laptop computer, or a tablet computer. The controller 170 may include a simple controller, a complicated processor such as a microprocessor, a central processing unit (CPU), or a graphics processing unit (GPU), a processor configured by software, exclusive hardware, or exclusive firmware. The controller 170 may be implemented by, for example, a general-purpose computer or application-specific hardware such as a digital signal processor (DSP), a field programmable gate array (FPGA), or an application specific integrated circuit (ASIC).

According to embodiments, an operation of the controller 170 may be implemented by instructions stored in a machine-readable medium, which are readable and executable by one or more processors. Herein, the machine-readable medium may include an arbitrary mechanism configured to store and/or transmit information in a form readable by a machine (e.g., a computing device). For example, the machine-readable medium may include read-only memory (ROM), random access memory (RAM), a magnetic disk storage medium, an optical storage medium, flash memory devices, a radio wave signal of an electrical form, an optical form, an acoustic form, or another form (e.g., a carrier, an infrared signal, a digital signal, or the like), and other random signals.

In addition, firmware, software, routines, or instructions may be configured to perform the aforementioned operations of the controller 170 or one or more processes to be described below. For example, the controller 170 may be implemented by software configured to generate a signal for running the first and second process gas supply devices 121 and 125, the first power source 131, the wafer supporter 140, the second power source 151, and the vacuum pumping system 160. However, this is for convenience of description, and the aforementioned operations of the controller 170 may be caused by a computing device, a processor, firmware, software, or another device configured to execute routines, instructions, and the like.

Figure 2:
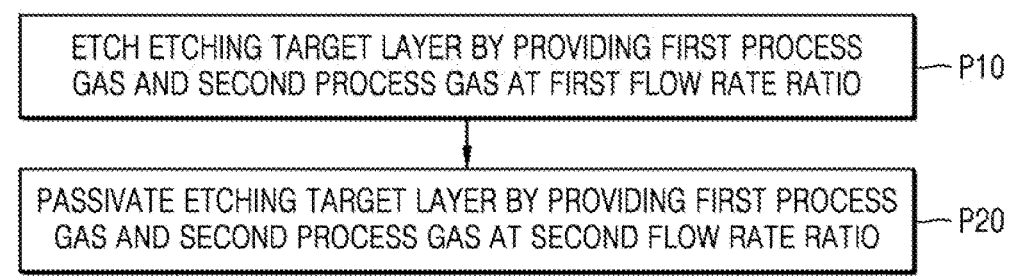
FIG. 2 is a flowchart of a method of manufacturing a semiconductor device, according to embodiments.

FIG. 2 is a flowchart of a method of manufacturing a semiconductor device, according to embodiments.

Figure 3:
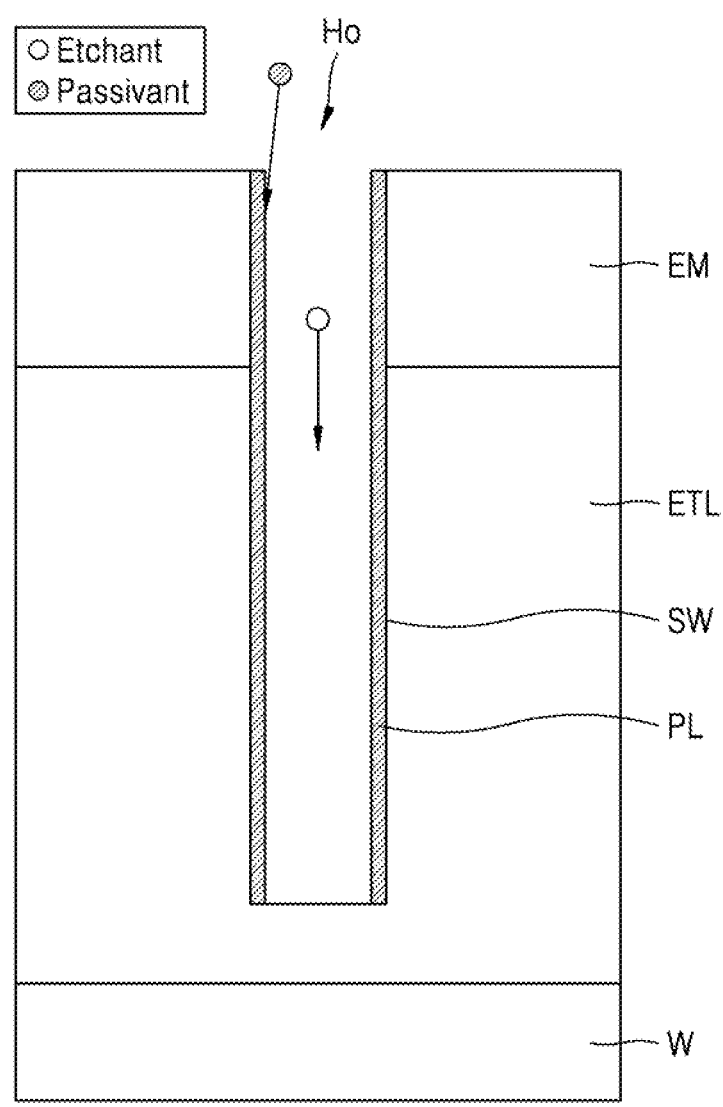
FIG. 3 is a cross-sectional view for describing the method of manufacturing a semiconductor device, according to embodiments.

FIG. 3 is a cross-sectional view for describing the method of manufacturing a semiconductor device, according to embodiments.

Figure 4:
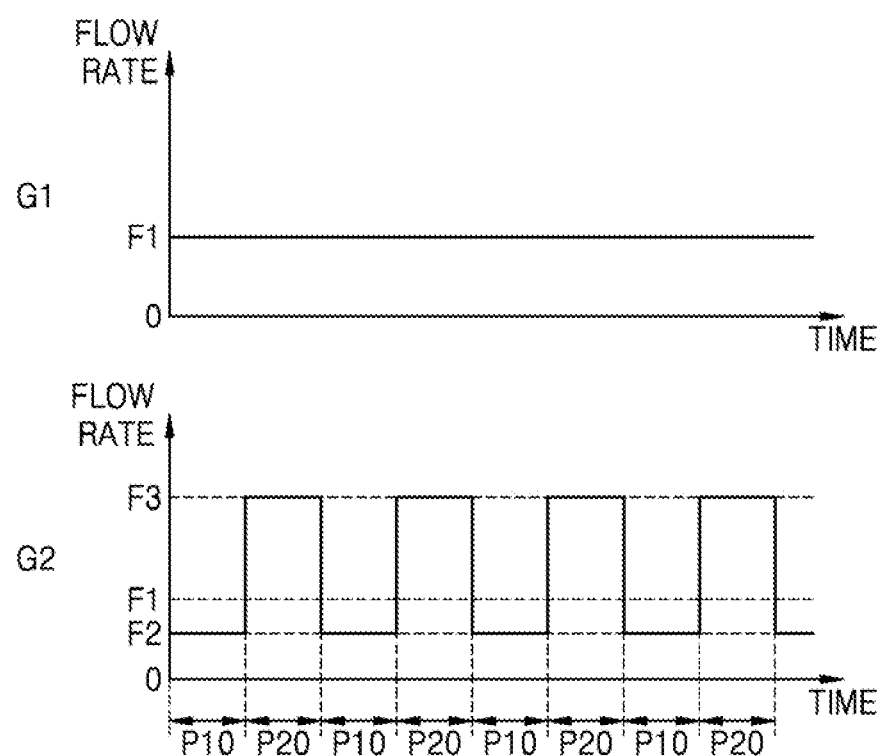
FIG. 4 is a graph for describing the method of manufacturing a semiconductor device, according to embodiments.

FIG. 4 is a graph for describing the method of manufacturing a semiconductor device, according to embodiments.

Referring to FIGS. 1 to 4, the method of manufacturing a semiconductor device may include operation P10 of etching an etch target layer ETL by providing the first process gas G1 and the second process gas G2 at a first flow rate ratio, and operation P20 of passivating the etch target layer ETL by providing the first process gas G1 and the second process gas G2 at a second flow rate ratio.

Herein, each of the first and second flow rate ratios is a ratio of a flow rate of the second process gas G2 to a flow rate of the first process gas G1, and follows an equation below. In addition, this is the same for third and fourth flow rate ratios to be described below with reference to FIGS. 7 and 8.

$$\text{Flow rate ratio} = \frac{\text{flow rate of second process gas } G2}{\text{flow rate of first process gas } G1} \quad \text{[Equation]}$$

According to embodiments, the etch target layer ETL and an etch mask EM may be formed on the wafer W. The etch target layer ETL may include an insulating material, for example, a silicon oxide, a silicon nitride, a silicon oxynitride, or the like, but is not limited thereto. The etch mask EM may include, for example, amorphous silicon. By performing operation P10, a hole Ho of a high aspect ratio may be formed in the etch target layer ETL, and by performing operation P20, a passivation layer PL may be formed on a side wall SW of the hole Ho while the hole Ho is formed in the etch target layer ETL. According to embodiments, because the passivation layer PL is formed on the side wall SW of the hole Ho while performing the etching process of forming the hole Ho in the etch target layer ETL, a bowing of profile of the side wall SW of the hole Ho, area mismatch between an upper part and a lower part of the hole Ho, and eccentricity (i.e., misalignment between the upper part and the lower part of the hole) may be alleviated or prevented, and thus, the reliability of semiconductor device manufacturing may be enhanced.

The first process gas G1 may include an etchant gas. The first process gas G1 may be oxygen (O)-containing gas. According to embodiments, the first process gas G1 may include 02. However, the first process gas G1 is not limited thereto, and the first process gas G1 may include various materials including oxygen, such as reactive oxygen species (O), ozone ($O_3$), carbon monoxide (CO), carbon dioxide ($CO_2$), nitrogen monoxide (NO), nitrous oxide ($N_2O$), and nitrogen dioxide ($NO_2$), or a combination thereof.

The first process gas G1 may be provided to be substantially constant over operations P10 and P20. The first process gas G1 may be provided to be substantially constant at a first flow rate F1. According to embodiments, the first flow rate F1 may be in a range of about 10 standard cc per minute (sccm) to about 40 sccm but is not limited thereto.

The second process gas G2 may include a passivant gas. Herein, passivant may indicate a material by which the passivation layer PL is deposited on a bottom surface and the side wall SW of the hole Ho. The second process gas G2 may include carbon and hydrogen. According to embodiments, the second process gas G2 may include, for example, hexafluoro-1,3-butadiene ($C_4F_6$). According to embodiments, when the second process gas G2 includes $C_4F_6$, the second process gas G2 has a relatively small molecular weight among organic fluorine compounds, and thus, the passivation layer PL may be effectively formed inside the hole Ho having a small hole diameter and a high aspect ratio. However, the second process gas G2 is not limited thereto, and the second process gas G2 may include various materials including carbon and fluorine, such as fluoromethane ($CH_3F$), difluoromethane ($CH_2F$), fluoroform ($CHF_3$), carbon tetrafluoride ($CF_4$), difluoroacetylene ($C_2F_2$), tetrafluoroethylene ($C_2F_4$), hexafluoroethane ($C_2F_6$), hexafluoropropylene ($C_3F_6$), octafluoropropane ($C_3F_8$), tetrafluorotetrahedrane ($C_4F_4$), perfluorobutane ($C_4F_{10}$), octafluorocyclopentane ($C_5F_8$), and decafluorocyclopentane ($C_5F_{10}$), or a combination thereof.

According to embodiments, a flow rate of the second process gas G2 may be variable. The second process gas G2 may be provided in a pulsed manner. More particularly, the second process gas G2 may be supplied at a second flow rate F2 that is less than the first flow rate F1 in operation P10, and supplied at a third flow rate F3 that is greater than the first flow rate F1 in operation P20. According to embodiments, the second process gas G2 may be provided in the pulsed manner, and the flow rate of the second process gas G2 may be greater than zero in each of operations P10 and P20. For example, the second flow rate F2 may be about 10 sccm, and the third flow rate F3 may be about 40 sccm, but the second and third flow rates F2 and F3 are not limited thereto.

According to embodiments, in operation P10, a ratio of the flow rate of the second process gas G2 to the flow rate of the first process gas G1, i.e., the first flow rate ratio, may be in a range of about 0.26 to about 1. According to embodiments, in operation P20, a ratio of the flow rate of the second process gas G2 to the flow rate of the first process gas G1, i.e., the second flow rate ratio, may be in a range of about 1 to about 2.74.

In operation P10, when the first flow rate ratio is less than about 0.26, there may occur a bowing phenomenon indicating that the side wall SW of the hole Ho is excessively etched. In operation P10, when the first flow rate ratio is about 1 or more, an etching process may not be substantially performed, and there may occur a non-open defect indicating that the hole Ho is blocked due to excessive deposition of the passivant gas.

In operation P20, when the second flow rate exceeds about 2.74, there may occur the non-open defect indicating that the hole Ho is blocked due to excessive deposition of the passivant gas. In operation P20, when the second flow rate is less than about 1, it may not be sufficient to passivate the side wall SW of the hole Ho.

According to embodiments, operations P10 and P20 may be alternately and iteratively performed until the etch target layer ETL is etched up to an etching target amount. However, operations P10 and P20 are not limited thereto, and may continue or end based on the number of cycles (i.e., the number of iterations).

According to embodiments, in operation P10, an etching reaction by the first process gas G1 may be dominant compared to a deposition reaction (i.e., forming the passivation layer PL) by the second process gas G2. According to embodiments, in operation P20, the deposition reaction by the second process gas G2 may be dominant compared to the etching reaction by the first process gas G1. Accordingly, operation P10 may be a substantial etching period in which the hole Ho of the etch target layer ETL is etched, and operation P20 may be a substantial passivation period in which the passivation layer PL for passivating the side wall SW of the hole Ho of the etch target layer ETL is formed.

According to embodiments, in each of operations P10 and P20, additional process gases such as octafluorocyclobutane ($C_4F_8$) and nitrogen trifluoride ($NF_3$) may be further provided by the control of at least one of the first and second process gas supply devices 121 and 125. The process gases including $C_4F_8$, $NF_3$, and the like may be, for example, an etchant gas, a passivant gas, or a gas which does not participate in a reaction. According to embodiments, $C_4F_6$ may form the passivation layer PL on a place (i.e., a lower part of the hole Ho) relatively close to the wafer W in the hole Ho, and $C_4F_8$ may form the passivation layer PL on a place (i.e., an upper part of the hole Ho) relatively far from the wafer W in the hole Ho. According to embodiments, $C_4F_8$ and $NF_3$ may be supplied at a substantially constant flow rate. According to embodiments, a supply flow rate of $C_4F_8$ may be about 20 sccm, and a supply flow rate of $NF_3$ may be about 10 sccm, but these supply flow rates are not limited thereto.

According to embodiments, in operations P10 and P20, the first and second power sources 131 and 151 may each generate and supply substantially constant powers. The substantially constant power supplied by each of the first and second power sources 131 and 151 may indicate that the first and second power sources 131 and 151 are not turned off to supply substantially constant effective power or average power. That is, the first and second power sources 131 and 151 may supply continuous power instead of pulsed power in operations P10 and P20. According to embodiments, the first and second power sources 131 and 151 may maintain a turn-on state over operations P10 and P20.

An embodiment in which the first process gas G1, that is an etchant gas, is provided to be substantially constant at the first flow rate F1, and the flow rate of the second process gas G2, that is a passivant gas, follows a pulse varying between the second flow rate F2 and the third flow rate F3, has been described. Those of ordinary skill in the art may easily achieve the embodiment of FIG. 4 in which a passivant gas having a substantially constant flow rate like the first process gas G1 and an etchant gas having a varying flow rate like the second process gas G2 are provided to the process chamber 110, based on the description made herein.

Figure 5:
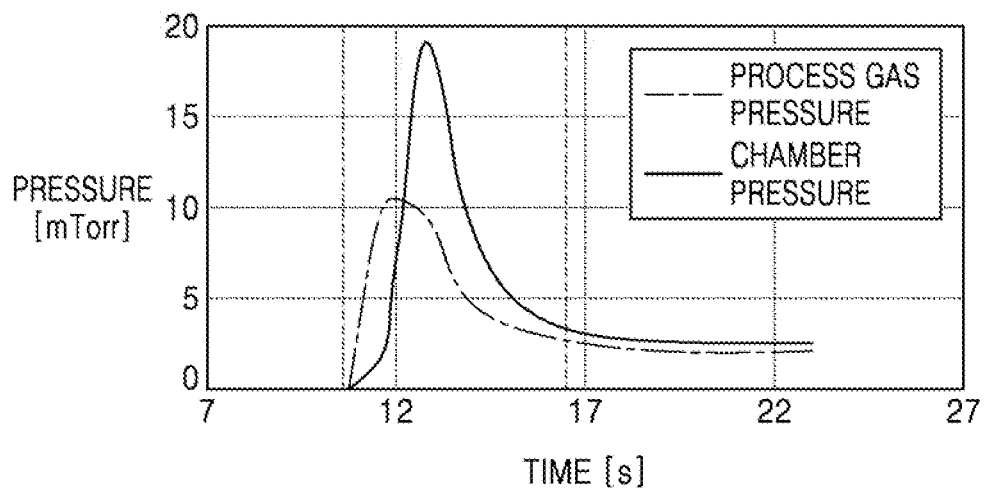
FIG. 5 is a graph for describing an effect of the method of manufacturing a semiconductor device, according to embodiments.

FIG. 5 is a graph for describing an effect of the method of manufacturing a semiconductor device, according to embodiments. FIG. 5 shows a change in pressure of gases, including the first and second process gases G1 and G2 (see FIG. 1), introduced to the inside of the process chamber 110 (see FIG. 1) and a change in pressure of the inside of the process chamber 110.

Referring to FIGS. 1 and 5, it is confirmed that any one of the first and second process gases G1 and G2 starts to be supplied at about eight seconds, and pressure of the inside of the process chamber 110 reaches a steady state at about 16 seconds. Accordingly, it is confirmed that it takes about eight seconds to stabilize the pressure of the inside of the process chamber 110.

In an existing RIE process, at least any one of the etchant gas and the passivant gas is pulsed to be on and off, and accordingly, etchant and passivant are pulsed to have a phase difference of 180 degrees. For example, the RIE process includes a first period and a second period coming alternately and iteratively, wherein, in the first period, the passivant gas is not supplied to a process chamber, and the etchant gas is supplied to the process chamber, and in the second period, the etchant gas is not supplied to the process chamber, and the passivant gas is supplied to the process chamber.

Accordingly, in the existing RIE process, when a passivation period exceeds five seconds (e.g., when the passivation period is 10 seconds or more), there occurs the non-open defect indicating that an upper part of a hole is blocked due to the passivant gas. Accordingly, in the existing RIE process, a continuance time of each of the first period in which the etchant gas is supplied and the second period in which the passivant gas is supplied is about five seconds or less.

In this case, a subsequent process (e.g., supply of the passivant gas) is performed before an air current inside the process chamber is stabilized under an atmosphere condition according to performing any process (e.g., supply of the etchant gas), and thus, the air current inside the process chamber is unstabilized, and the reliability of semiconductor device manufacturing is lowered.

Referring back to FIGS. 1 to 4, the first process gas G1 is supplied to be substantially constant in operations P10 and P20, and thus, a continuance time of each of operations P10 and P20 may be increased. The continuance time of each of operations P10 and P20 may be greater than five seconds. According to embodiments, the continuance time of each of operations P10 and P20 may be eight seconds or more. According to embodiments, the continuance time of each of operations P10 and P20 may be 10 seconds or more. According to embodiments, the continuance time of each of operations P10 and P20 may be 20 seconds or more. According to embodiments, the continuance time of each of operations P10 and P20 may be 50 seconds or less. When the continuance time of each of operations P10 and P20 is greater than 50 seconds, the hole Ho is blocked due to excessive deposition of the passivant gas. According to embodiments, the continuance time of each of operations P10 and P20 is sufficiently long to stabilize an air current inside the process chamber 110, and thus, the reliability of semiconductor device manufacturing may be enhanced.

Figure 6:
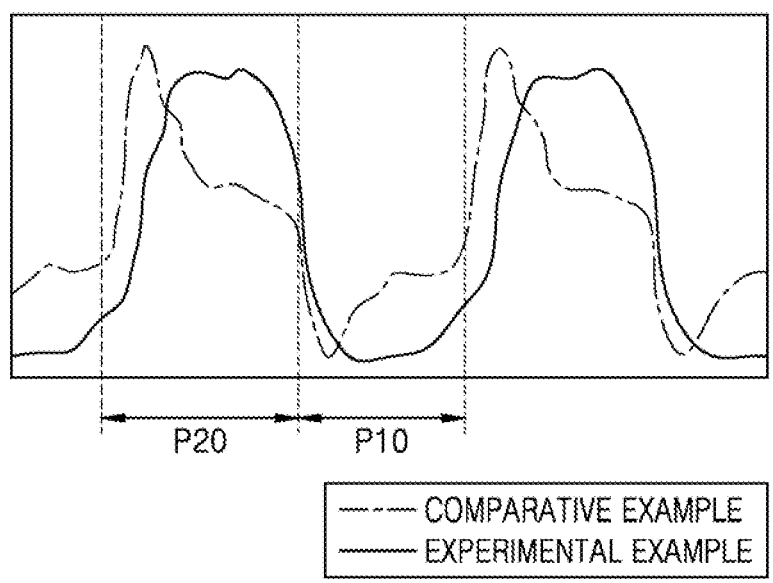
FIG. 6 is a graph for describing an effect of the method of manufacturing a semiconductor device, according to embodiments.

FIG. 6 is a graph for describing an effect of the method of manufacturing a semiconductor device, according to embodiments. More particularly, in FIG. 6, the vertical axis indicates a radiation strength axis, and the horizontal axis indicates a time axis. FIG. 6 shows a strength of radiation caused by the plasma PLA (see FIG. 1) inside the process chamber 110 (see FIG. 1) in a comparative example and an experimental example, wherein the strength of radiation is proportional to a concentration of the plasma PLA (see FIG. 1). Accordingly, a change in the concentration of the plasma PLA may be obtained from a change in the strength of radiation shown in FIG. 6.

Referring to FIGS. 1 and 6, in the experimental example, the first and second process gases G1 and G2 are provided in the same manner as described with reference to FIG. 4. In the comparative example, the first and second process gases G1 and G2 are provided as a pulse in an on/off manner having a phase difference of 180 degrees, as described with reference to FIG. 5.

It is confirmed in the experimental example that a strength of radiation caused by the plasma PLA is close to a square wave when compared with the comparative example, and that the controllability and uniformity of plasma concentration are enhanced. Accordingly, the reliability of semiconductor device manufacturing may be enhanced.

Figure 7A:
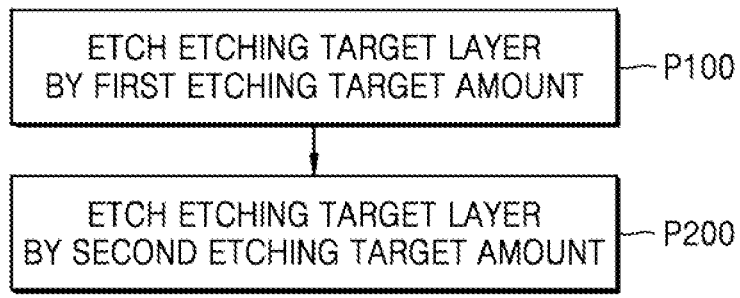
FIGS. 7A to 7C are flowcharts of a method of manufacturing a semiconductor device, according to embodiments.
Figure 7B:
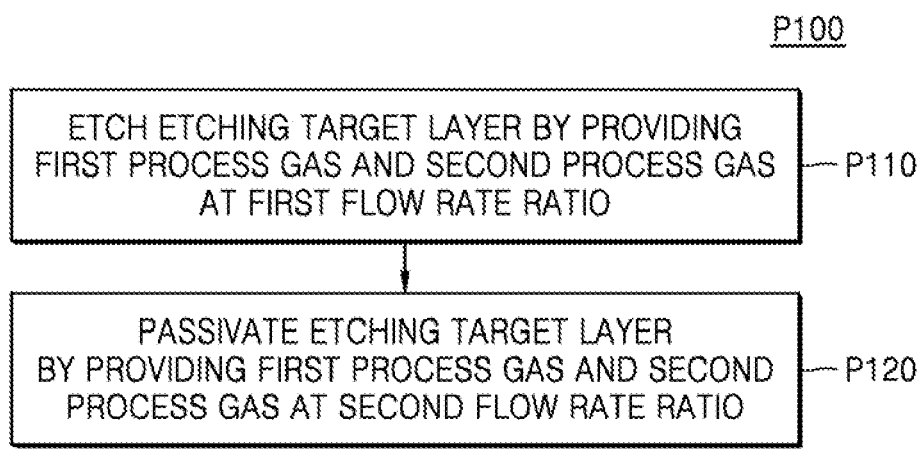
Figure 7C:
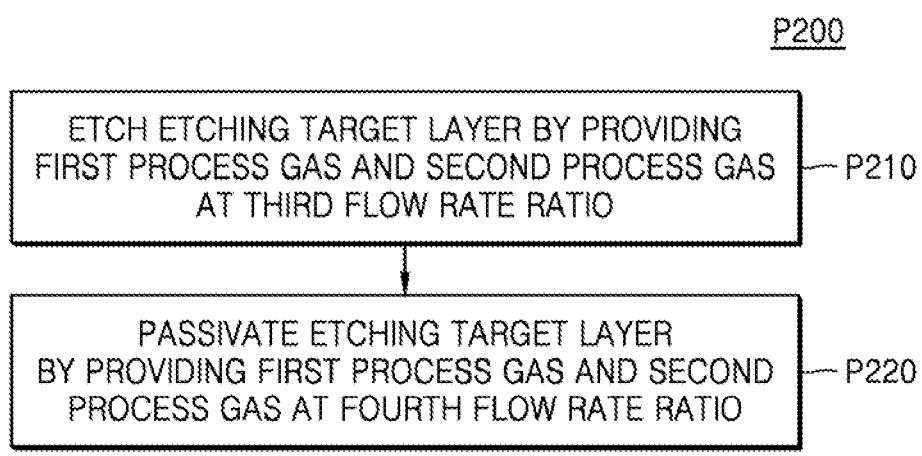

FIGS. 7A to 7C are flowcharts of a method of manufacturing a semiconductor device, according to embodiments.

Figure 8:
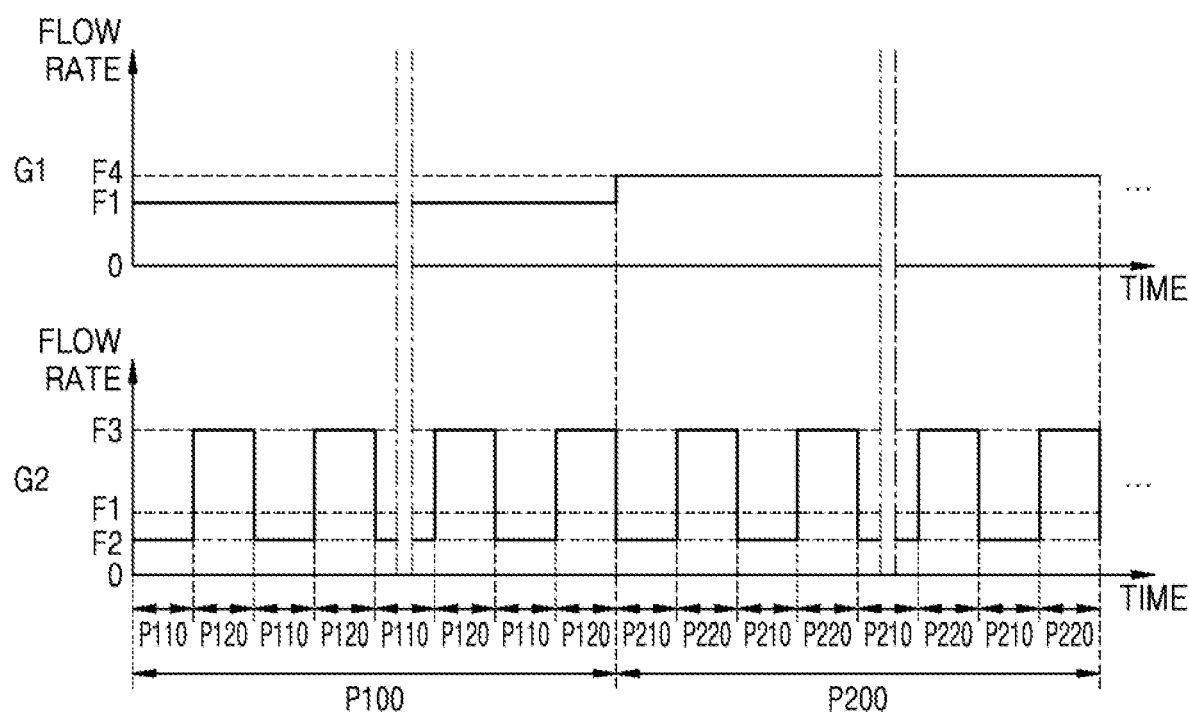
FIG. 8 is a graph for describing the method of manufacturing a semiconductor device, according to embodiments.

FIG. 8 is a graph for describing the method of manufacturing a semiconductor device, according to embodiments.

For convenience of description, the description made with reference to FIGS. 1 to 4 is not repeated, and a difference from the description is mainly described.

Referring to FIGS. 1, 3, and 7A to 8, the method of manufacturing a semiconductor device may include operation P100 of etching the etch target layer ETL by a first etching target amount, and operation P200 of etching the etch target layer ETL by a second etching target amount.

Operation P100 may include operation P110 of etching the etch target layer ETL by providing the first process gas G1 and the second process gas G2 at the first flow rate ratio, and operation P120 of passivating the etch target layer ETL by providing the first process gas G1 and the second process gas G2 at the second flow rate ratio.

Operation P100 may end after each of operations P110 and P120 is performed, for example, 30 times to 50 times. Operations P110 and P120 may be substantially the same as operations P10 and P20 described with reference to FIGS. 1 to 4, respectively, and thus, a duplicated description thereof is omitted.

Operation P200 may include operation P210 of etching the etch target layer ETL by providing the first process gas G1 and the second process gas G2 at a third flow rate ratio, and operation P220 of passivating the etch target layer ETL by providing the first process gas G1 and the second process gas G2 at a fourth flow rate ratio. According to embodiments, the third flow rate ratio may be less than the first flow rate ratio. According to embodiments, the fourth flow rate ratio may be less than the second flow rate ratio.

According to embodiments, a flow rate of the second process gas G2 in operation P210 may be the second flow rate F2, and a flow rate of the second process gas G2 in operation P220 may be the third flow rate F3. According to embodiments, the flow rate of the second process gas G2 in operation P210 may be substantially the same as a flow rate of the second process gas G2 in operation P110, and the flow rate of the second process gas G2 in operation P220 may be substantially the same as a flow rate of the second process gas G2 in operation P120.

According to embodiments, while performing a substantial etching process in operation P210 and a substantial passivation process in operation P220, a flow rate of the first process gas G1 may be substantially constant. According to embodiments, in operations P210 and P220, the first process gas G1 may be supplied at a fourth flow rate F4 that is greater than the first flow rate F1 and less than the third flow rate F3. According to embodiments, the fourth flow rate F4 may be in a range of about 10 sccm to about 40 sccm but is not limited thereto.

According to embodiments, operations P210 and P220 may be alternately and iteratively performed until the etch target layer ETL is etched up to the second etching target amount. However, the inventive concept is not limited thereto, and operations P210 and P220 may continue or end based on the number of cycles (i.e., the number of iterations). Operation P200 may end after each of operations P210 and P220 is performed, for example, 30 times to 50 times.

According to embodiments, after achieving the first etching target amount, an amount of the first process gas G1 supplied at a substantially constant amount may be increased to efficiently perform an etching process on the hole Ho, which is relatively deep.

Those of ordinary skill in the art may easily achieve, based on the description made herein, a method of manufacturing a semiconductor device, in which a flow rate of the first process gas G1 increases a plurality of times (i.e., twice or more) based on an etching amount of the etch target layer ETL.

Table 1 below shows an example in which flow rates of the first process gas G1 and the second process gas G2 are adjusted according to an etching amount. More particularly, the example of Table 1 relates to a method of manufacturing a semiconductor device, in which a flow rate of the first process gas G1 increases four times.

TABLE 1

| Step | | Initial stage | After achieving a first etching amount | After achieving a second etching amount | After achieving a third etching amount | After achieving a fourth etching amount |
|---|---|---|---|---|---|---|
| Etching | G1 | 19.8 | 22.9 | 26.0 | 29.1 | 32.2 |
| | G2 | 10 | 10 | 10 | 10 | 10 |
| | Flow rate ratio (G2/G1) | 0.51 | 0.44 | 0.38 | 0.34 | 0.31 |
| Passivation | G1 | 19.8 | 22.9 | 26.0 | 29.1 | 32.2 |
| | G2 | 40 | 40 | 40 | 40 | 40 |
| | Flow rate ratio (G2/G1) | 2.02 | 1.75 | 1.54 | 1.37 | 1.24 |

In Table 1, the flow rate ratio is a dimensionless amount, and a unit of the other numbers is sccm. In Table 1, the second etching amount is greater than the first etching amount, the third etching amount is greater than the second etching amount, and the fourth etching amount is greater than the third etching amount. Accordingly, a depth-dependent method of manufacturing a semiconductor device, in which a flow rate of the first process gas G1 increases as a depth of the hole Ho formed in the etch target layer ETL increases, may be provided.

Figure 9:
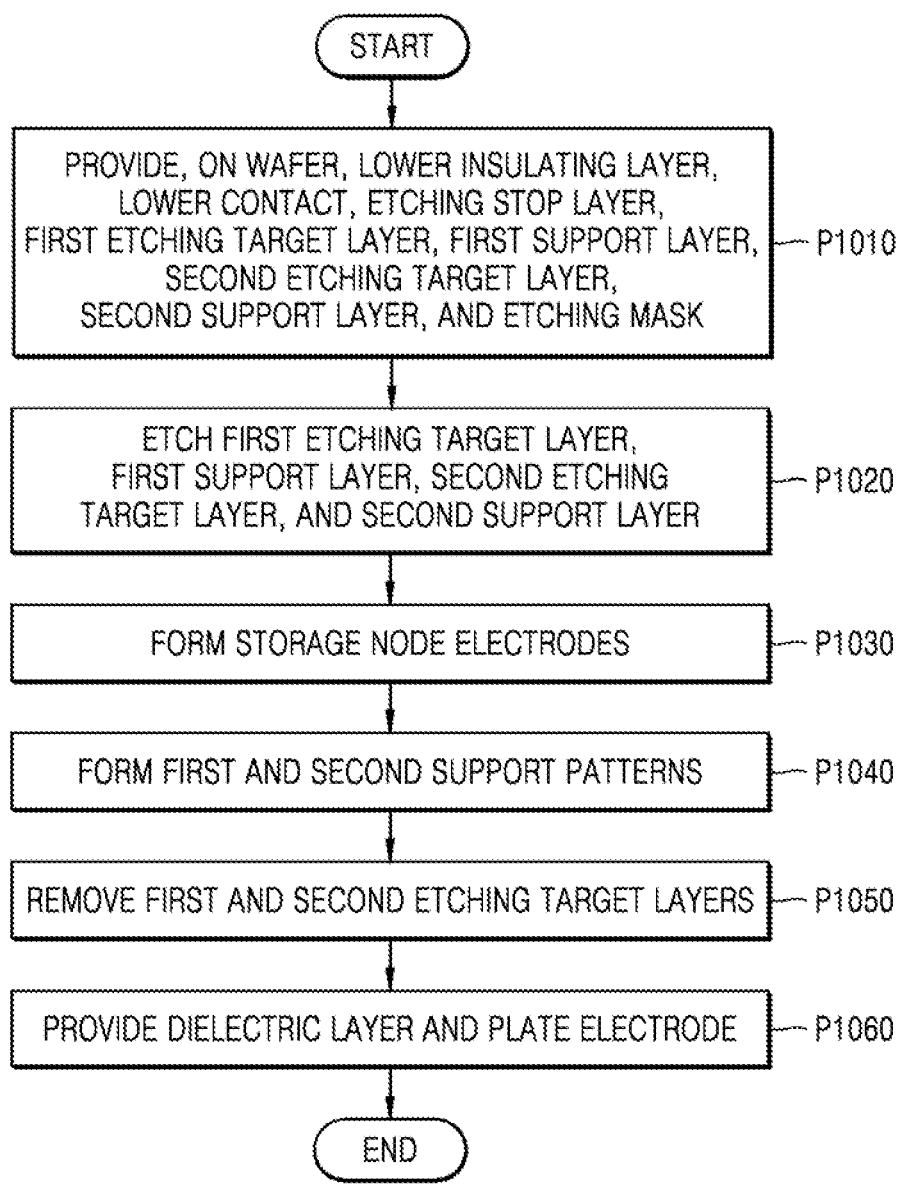
FIG. 9 is a flowchart of a method of manufacturing a semiconductor device, according to embodiments.

FIG. 9 is a flowchart of a method of manufacturing a semiconductor device, according to embodiments.

FIGS. 10 to 15 are cross-sectional views for describing the method of manufacturing a semiconductor device, according to embodiments.

Figure 10:
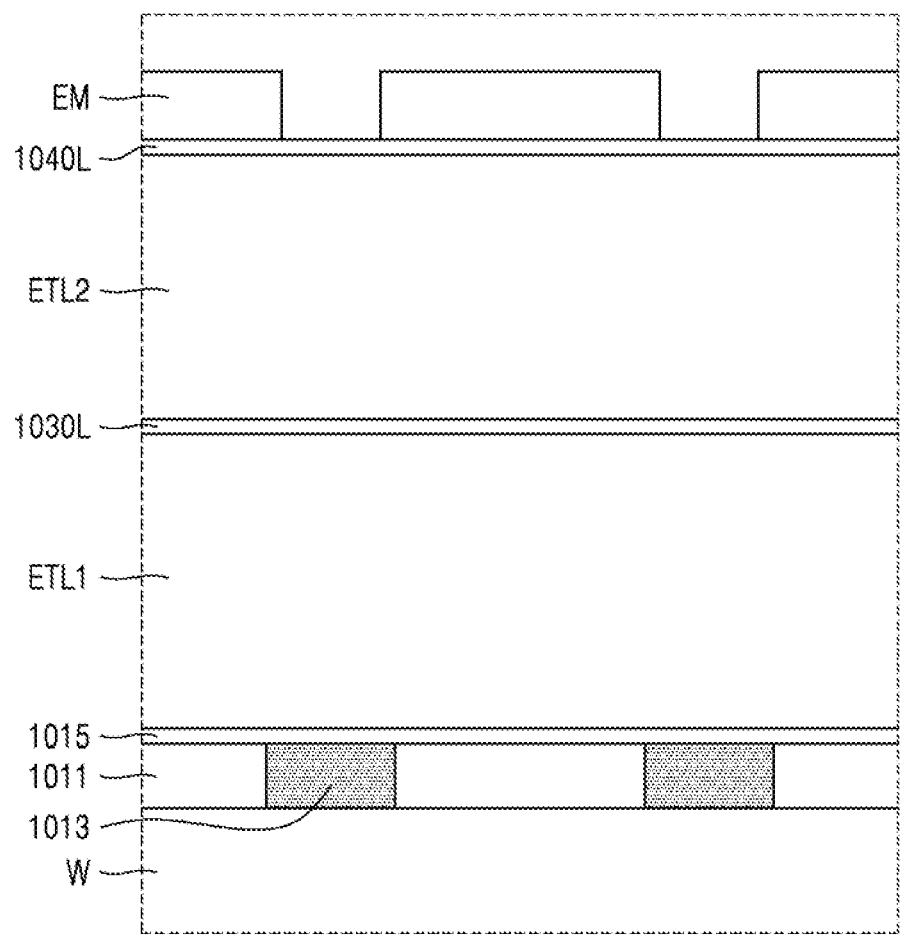
FIGS. 10 to 15 are cross-sectional views for describing the method of manufacturing a semiconductor device, according to embodiments.

Referring to FIGS. 9 and 10, in operation P1010, a lower insulating layer 1011, a lower contact 1013, an etch stop layer 1015, a first etch target layer ETL1, a first support layer 1030L, a second etch target layer ETL2, a second support layer 1040L, and the etch mask EM may be provided on the wafer W.

According to embodiments, the wafer W may include substantially the same material as described with reference to FIG. 1. According to embodiments, the lower insulating layer 1011 may include a silicon oxide layer, a silicon nitride layer, a silicon oxynitride layer, or the like. The lower insulating layer 1011 may include a silicon oxide-based material such as a polyethylene oxide (PEOX), a tetraethyl orthosilicate (TEOS), or silicate glass. According to embodiments, the lower insulating layer 1011 may be provided through a CVD process. According to embodiments, the lower insulating layer 1011 may be formed on the wafer W to cover a circuit device (not shown).

According to embodiments, the lower insulating layer 1011 may be partially etched to form a plurality of contact holes, and a conductive material layer may be provided to fill the plurality of contact holes. According to embodiments, the conductive material layer may be formed through a CVD process, a PVD process, an atomic layer deposition (ALD) process, or the like. According to embodiments, the conductive material layer may include substantially the same material as that of the lower contact 1013 to be described below. Thereafter, the lower contact 1013 may be formed by planarizing an upper part of the conductive material layer.

According to embodiments, the etch stop layer 1015 may be provided on the lower insulating layer 1011 and the lower contact 1013. According to some embodiments, the etch stop layer 1015 may include a material having a high etch selectivity with respect to the first and second etch target layers ETL1 and ETL2. According to embodiments, the etch stop layer 1015 may include a silicon nitride, a silicon carbonitride, a silicon boride, a silicon boronitride, or the like.

According to embodiments, the etch stop layer 1015 may be formed through a CVD process, a low pressure CVD process, a plasma enhanced CVD (PECVD) process, a PVD process, an ALD process, or the like.

The second support layer 1040L, the second etch target layer ETL2, the first support layer 1030L, and the first etch target layer ETL1 may be sequentially formed on the etch stop layer 1015. According to embodiments, the first and second etch target layers ETL1 and ETL2 may include an oxide layer. According to embodiments, the first and second etch target layers ETL1 and ETL2 may include an oxide layer such as boron phosphorous silicate glass (BPSG), a spin on dielectric (SOD), phosphorous silicate glass (PSG), a low pressure tetra ethyl ortho silicate (LPTEOS), or a plasma enhanced tetra ethyl ortho silicate (PETEOS). According to embodiments, a sum of thicknesses of the first and second etch target layers ETL1 and ETL2 may be about 500 nm to about 4000 nm but is not limited thereto. According to embodiments, the first and second etch target layers ETL1 and ETL2 may be formed through a CVD process or a spin coating process.

According to embodiments, the first and second support layers 1030L and 1040L may include a silicon nitride layer, an undoped polysilicon layer, or the like. According to embodiments, the first and second support layers 1030L and 1040L may have a thickness of about 20 nm to about 150 nm.

The etch mask EM may include, for example, an anti-reflective coating (not shown), a hard mask pattern, and a photoresist pattern. According to embodiments, the photoresist pattern may be formed by providing an anti-reflective material layer, a hard mask layer, and a photoresist layer and then patterning the photoresist layer by exposure and development. Thereafter, the etch mask EM may be formed by using the photoresist pattern to pattern the hard mask layer and the anti-reflective material layer.

According to embodiments, a sacrificial layer for passivating the second support layer 1040L may be additionally provided in a node separation process of forming a storage node electrode 1020 (see FIG. 12) between the etch mask EM and the second support layer 1040L.

Figure 11:
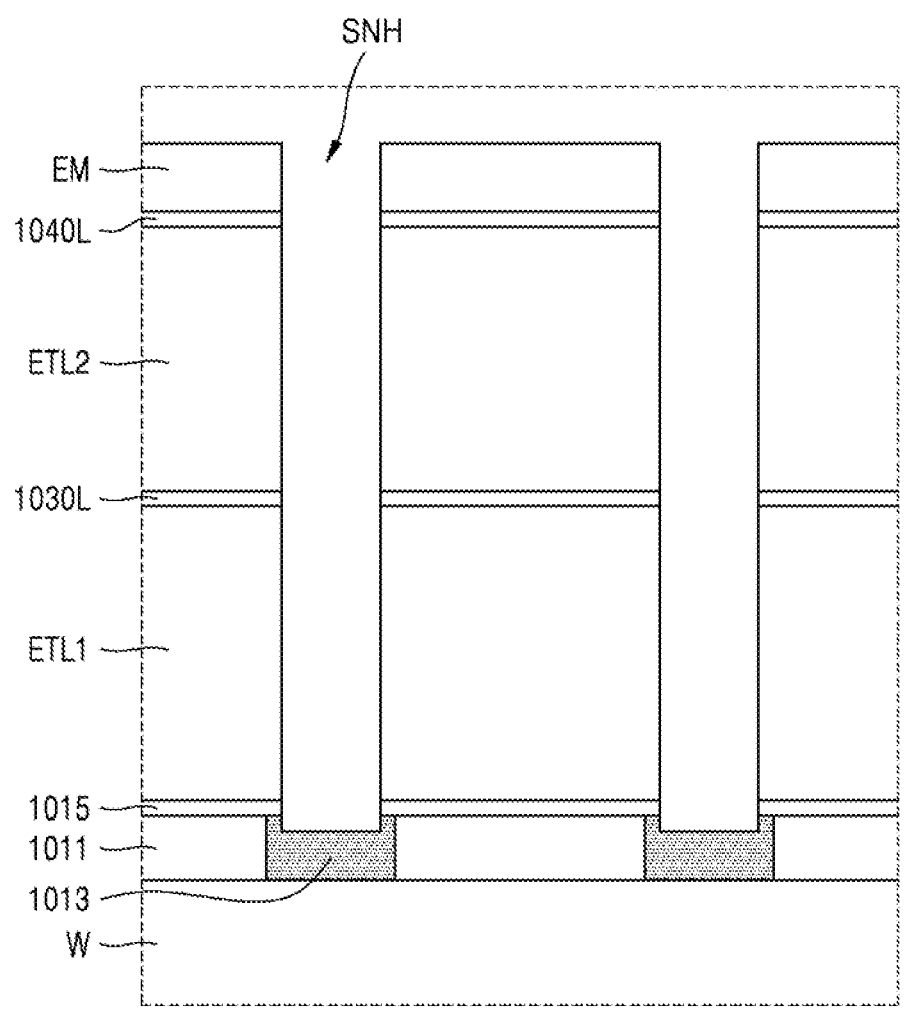

Thereafter, referring to FIGS. 9 to 11, in operation P1020, the second support layer 1040L, the second etch target layer ETL2, the first support layer 1030L, and the first etch target layer ETL1 may be etched by using the etch mask EM. Accordingly, a plurality of storage node holes SNH, which expose an upper surface of the lower contact 1013, may be formed.

According to embodiments, the etching process of operation P1020 may include any one of the etching method described with reference to FIGS. 1 to 4 and the depth-dependent etching method described with reference to FIGS. 7A to 8. According to embodiments, the etching process of operation P1020 may be an etching process in which $O_2$ is used as an etchant gas, and $C_4F_6$ is used as a passivant gas. The etching process of operation P1020 may include a first etching process in which the etch stop layer 1015 is an end point of etching and a second etching process in which the etch stop layer 1015 is partially removed to expose the lower contact 1013.

According to embodiments, when the etching process of operation P1020 is performed by using any one of the method described with reference to FIGS. 1 to 4 and the method described with reference to FIGS. 7A to 8, defects due to a bridge between adjacent storage node holes SNH are reduced by about 60%, defects due to non-open of the plurality of storage node holes SNH are reduced by about 40%, and total defects are reduced by about 45%. After performing the etching process of operation P1020, the etch mask EM may be removed.

Figure 12:
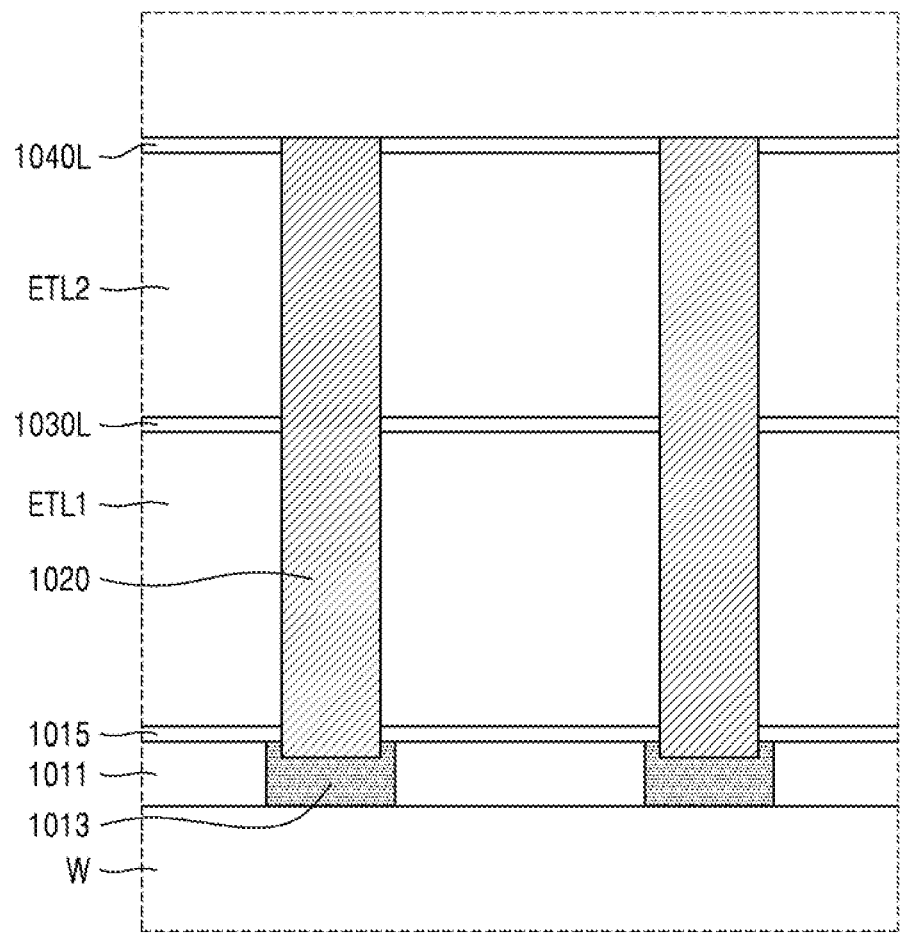

Thereafter, referring to FIGS. 9, 11, and 12, in operation P1030, storage node electrodes 1020 may be formed. The storage node electrodes 1020 may be formed by providing a conductive material filling the plurality of storage node holes SNH, and performing a node separation process thereon. According to embodiments, the node separation process may be performed by dry etch back, chemical mechanical polishing (CMP), or the like.

According to embodiments, the storage node electrodes 1020 may include any one of a metal nitride layer, a metal layer, and a material layer in which a metal nitride is combined with a metal. According to embodiments, the storage node electrodes 1020 may include any one of titanium nitride (TiN), ruthenium (Ru), tantalum nitride (TaN), tungsten nitride (WN), platinum (Pt), and iridium (Ir).

Figure 13:
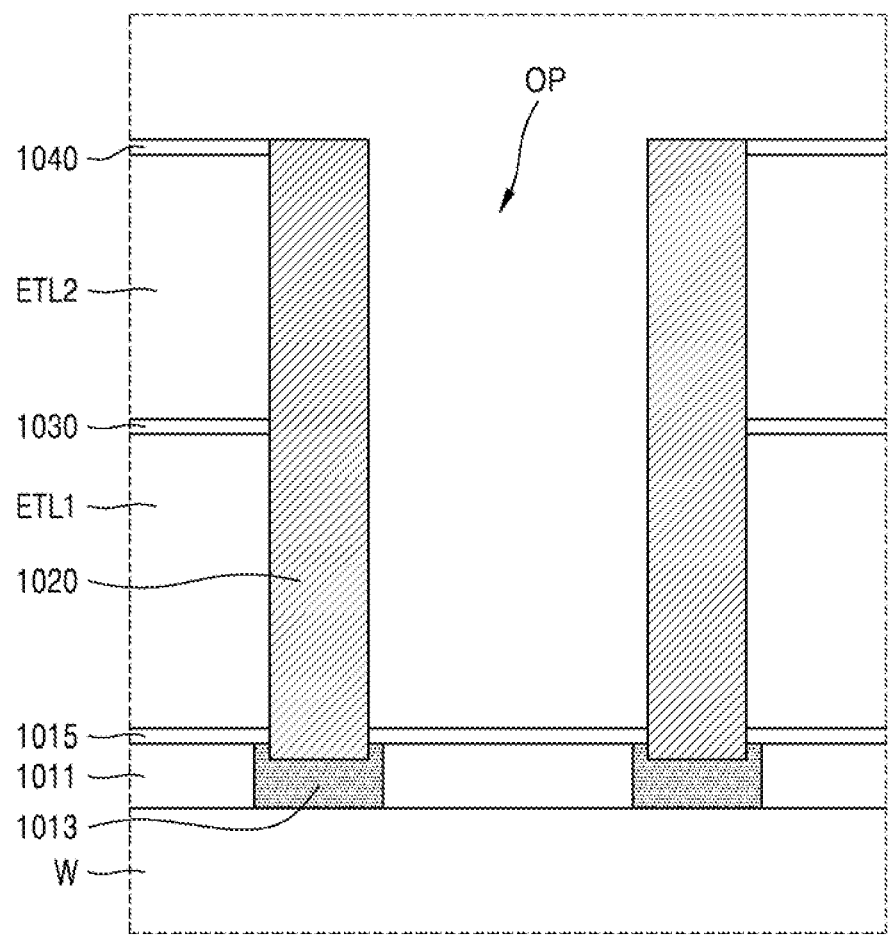

Thereafter, referring to FIGS. 9, 12, and 13, in operation P1040, first and second support patterns 1030 and 1040 may be formed. After forming the etch mask EM (see FIG. 10) on the second support layer 1040L, the second support layer 1040L, the second etch target layer ETL2, the first support layer 1030L, and the first etch target layer ETL1 may be etched by using the etch mask EM (see FIG. 10), thereby forming the first and second support patterns 1030 and 1040. According to embodiments, the first and second support patterns 1030 and 1040 may include a plurality of open regions OP. According to embodiments, each of the storage node electrodes 1020 may be partially exposed by the open region OP.

Figure 14:
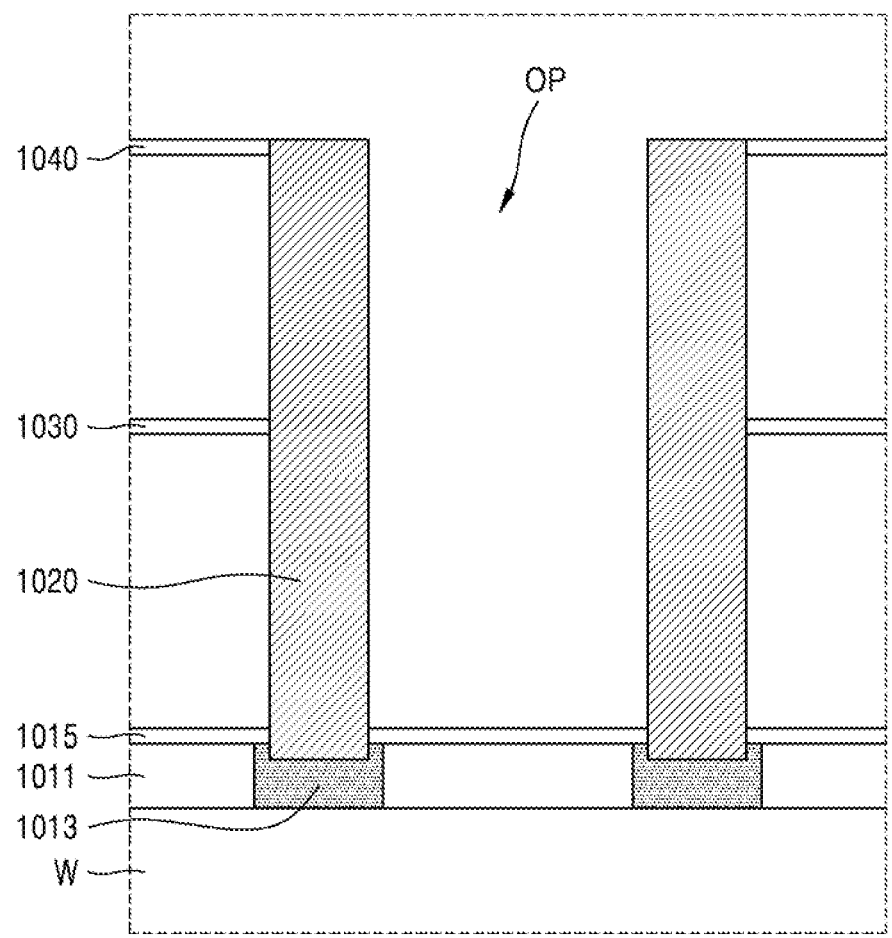

Thereafter, referring to FIGS. 9, 13, and 14, in operation P1050, the first and second etch target layers ETL1 and ETL2 may be removed. According to embodiments, the first and second etch target layers ETL1 and ETL2 may be removed through a wet etching process. According to embodiments, the wet etching process may be performed by using a wet chemical such as a hydrofluoric acid or a buffered oxide etchant (BOE) solution. The wet chemical may flow in the plurality of open regions OP formed in the first and second support patterns 1030 and 1040 and remove the first and second etch target layers ETL1 and ETL2.

The first and second support patterns 1030 and 1040 may support the storage node electrodes 1020 not to collapse when the first and second etch target layers ETL1 and ETL2 are removed. In addition, the etch stop layer 1015 may support the storage node electrodes 1020 and simultaneously prevent the wet chemical from permeating into a lower structure of the storage node electrodes 1020 and then etching the lower insulating layer 1011.

Figure 15:
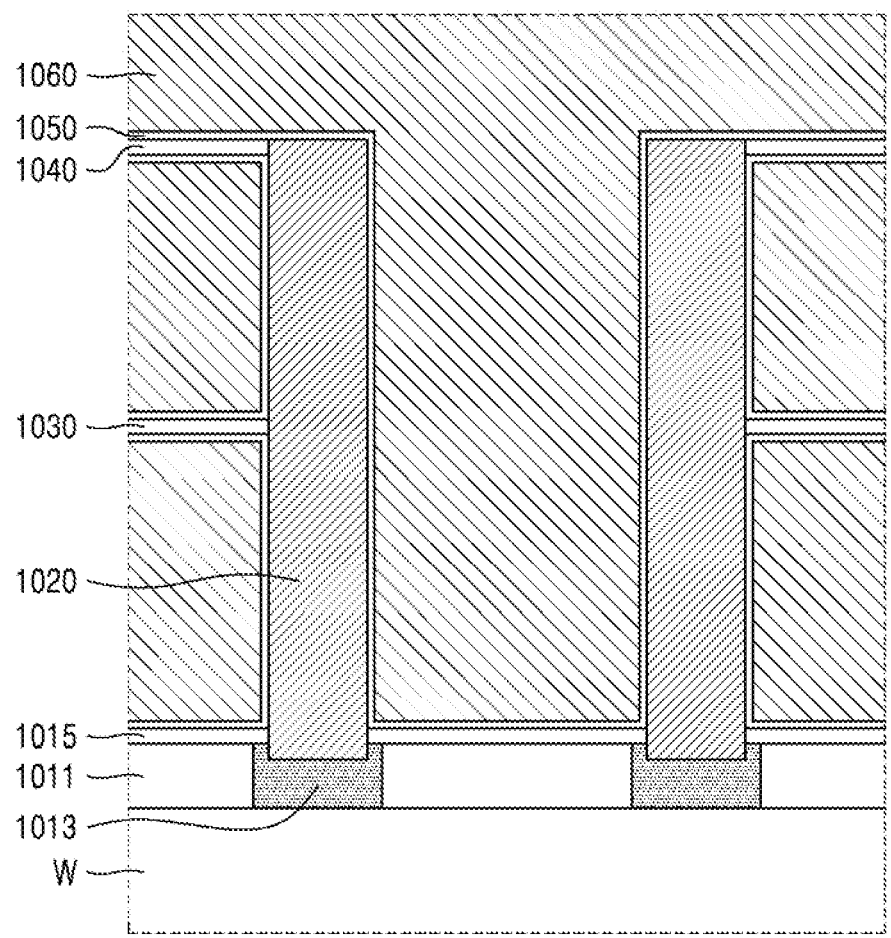

Thereafter, referring to FIGS. 9 and 15, in operation P1060, a dielectric layer 1050 and a plate electrode 1060 may be provided.

The dielectric layer 1050 may be conformally formed on an upper surface of the etch stop layer 1015, exposed surfaces of the first and second support patterns 1030 and 1040, and exposed surfaces of the storage node electrodes 1020.

The plate electrode 1060 may be formed on the dielectric layer 1050. According to embodiments, the plate electrode 1060 may be sufficiently provided to fill a space surrounded by the dielectric layer 1050. According to embodiments, the plate electrode 1060 may have a cap shape covering the storage node electrodes 1020.

Each of the storage node electrodes 1020, and a portion of the dielectric layer 1050 and a portion of the plate electrode 1060, which correspond to each of the storage node electrodes 1020, may constitute a charge storage device.

While the inventive concept has been particularly shown and described with reference to example embodiments thereof, it will be understood that various changes in form and details may be made therein without departing from the spirit and scope of the following claims.

What is claimed is:

1. A method of manufacturing a semiconductor device, the method comprising:
providing a first process gas comprising oxygen and second process gas comprising carbon and fluorine to a process chamber at a first flow rate ratio to etch an etch target layer, the process chamber providing a space for treating the etch target layer, the first flow rate ratio being a ratio of a flow rate of the second process gas to a flow rate of the first process gas; and
providing the first process gas and the second process gas to the process chamber at a second flow rate ratio to passivate the etch target layer, the second flow rate ratio being a ratio of a flow rate of the second process gas to a flow rate of the first process gas, wherein the providing of the first process gas and the second process gas at the first flow rate ratio and the providing of the first process gas and the second process gas at the second flow rate ratio are alternately and iteratively performed, wherein, in the providing of the first process gas and the second process gas at the first flow rate ratio and the providing of the first process gas and the second process gas at the second flow rate ratio, source power for generating plasma based on the first and second process gases and bias power for accelerating the plasma are provided to the process chamber to be substantially constant, and wherein, in the providing of the first process gas and the second process gas at the first flow rate ratio and the providing of the first process gas and the second process gas at the second flow rate ratio, the flow rate of the first process gas is substantially constant to be a first flow rate.

2. The method of claim 1, wherein the first flow rate ratio is in a range of 0.26 to 1.

3. The method of claim 1, wherein the second flow rate ratio is in a range of 1 to 2.74.

4. The method of claim 1, wherein, in the providing of the first process gas and the second process gas at the first flow rate ratio, the second process gas is provided at a second flow rate that is less than the first flow rate, and wherein, in the providing of the first process gas and the second process gas at the second flow rate ratio, the second process gas is provided at a third flow rate that is greater than the first flow rate.

5. The method of claim 4, wherein the first flow rate is in a range of 10 standard cc per minute (sccm) to 40 sccm.

6. The method of claim 1, wherein each of the providing of the first process gas and the second process gas at the first flow rate ratio and the providing of the first process gas and the second process gas at the second flow rate ratio continues for five seconds or more.

7. The method of claim 1, wherein each of the providing of the first process gas and the second process gas at the first flow rate ratio and the providing of the first process gas and the second process gas at the second flow rate ratio continues for eight seconds or more.

8. A method of manufacturing a semiconductor device, the method comprising:
  etching an etch target layer by providing a first process gas to a process chamber, in which a wafer is mounted, to be substantially constant at a first flow rate; and
  providing a second process gas to the process chamber at a pulse varying between a second flow rate and a third flow rate,
  wherein source power for generating plasma based on the first and second process gases and bias power for accelerating the plasma are provided to the process chamber to be constant,
  wherein one of the first process gas and the second process gas comprises an etchant gas, the other one thereof comprises a passivant gas, and
  wherein each of the first to third flow rates is greater than zero.

9. The method of claim 8, wherein the first process gas comprises an etchant gas, and the second process gas comprises a passivant gas.

10. The method of claim 8, wherein the first process gas comprises a passivant gas, and the second process gas comprises an etchant gas.

11. The method of claim 8, wherein the first process gas comprises oxygen, and the second process gas comprises carbon and fluorine.

12. The method of claim 8, wherein the first process gas comprises $O_2$, and the second process gas comprises hexafluoro-1,3-butadiene ($C_4F_6$).

13. The method of claim 8, wherein a ratio of the second flow rate to the first flow rate is in a range of 0.26 to 1.

14. The method of claim 8, wherein a ratio of the second flow rate to the first flow rate is in a range of 1 to 2.74.

15. A method of manufacturing a semiconductor device, the method comprising:
  etching an etch target layer by a first target etching amount; and
  further etching the etch target layer by a second target etching amount,
  wherein the etching of the etch target layer by the first target etching amount comprises:
  providing a first process gas comprising oxygen and a second process gas comprising carbon and fluorine to a process chamber at a first flow rate ratio to etch the etch target layer, the process chamber providing a space for treating the etch target layer and the first flow rate ratio being a ratio of a flow rate of the second process gas to a flow rate of the first process gas; and
  providing the first process gas and the second process gas to the process chamber at a second flow rate ratio to passivate the etch target layer, the second flow rate ratio being a ratio of a flow rate of the second process gas to a flow rate of the first process gas,
  wherein the providing of the first process gas and the second process gas at the first flow rate ratio and the providing of the first process gas and the second process gas at the second flow rate ratio are alternately and iteratively performed,
  wherein, in the providing of the first process gas and the second process gas at the first flow rate ratio and the providing of the first process gas and the second process gas at the second flow rate ratio, the first process gas is provided at a first flow rate that is substantially constant,
  wherein the further etching of the etch target layer by the second target etching amount comprises:
  providing the first process gas and the second process gas to the process chamber at a third flow rate ratio to etch the etch target layer, the third flow rate ratio being a ratio of a flow rate of the second process gas to a flow rate of the first process gas; and
  providing the first process gas and the second process gas to the process chamber at a fourth flow rate ratio to passivate the etch target layer, the fourth flow rate ratio being a ratio of a flow rate of the second process gas to a flow rate of the first process gas,
  wherein the providing of the first process gas and the second process gas at the third flow rate ratio and the providing of the first process gas and the second process gas at the fourth flow rate ratio are alternately and iteratively performed,
  wherein, in the providing of the first process gas and the second process gas at the third flow rate ratio and the providing of the first process gas and the second process gas at the fourth flow rate ratio, the first process gas is provided at a second flow rate that is substantially constant, and
  wherein the second flow rate is greater than the first flow rate.

16. The method of claim 15, wherein, in the providing of the first process gas and the second process gas at the first flow rate ratio, the second process gas is provided at a third flow rate that is less than the first flow rate, and wherein, in the providing of the first process gas and the second process gas at the second flow rate ratio, the second process gas is provided at a fourth flow rate that is greater than the first flow rate.

17. The method of claim 16, wherein, in the providing of the first process gas and the second process gas at the third flow rate ratio, the second process gas is provided at the third flow rate, and wherein, in the providing of the first process gas and the second process gas at the fourth flow rate ratio, the second process gas is provided at the fourth flow rate.

18. The method of claim 16, wherein the second flow rate is greater than the third flow rate and less than the fourth flow rate.

19. The method of claim 15, wherein the first process gas comprises $O_2$, and the second process gas comprises hexafluoro-1,3-butadiene ($C_4F_6$).

\* \* \* \* \*